(12) United States Patent  
Ohara et al.

(10) Patent No.: US 6,621,118 B2  
(45) Date of Patent: Sep. 16, 2003

(54) MOSFET, SEMICONDUCTOR DEVICE USING THE SAME AND PRODUCTION PROCESS THEREFOR

(75) Inventors: Masanori Ohara, Tenri (JP); Naoki Ueda, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/202,080

(22) Filed: Jul. 25, 2002

(65) Prior Publication Data

US 2003/0032227 A1 Feb. 13, 2003

(30) Foreign Application Priority Data

Aug. 8, 2001 (JP) ........................................ 2001-240865

(51) Int. Cl.[7] .............................................. H01L 21/76
(52) U.S. Cl. ................. 257/314; 257/315; 257/330; 257/341; 257/345; 257/401; 257/774
(58) Field of Search ................................ 257/314, 315, 257/316, 330, 329, 341, 342, 343, 344, 345, 401, 402, 403, 773, 774

(56) References Cited

U.S. PATENT DOCUMENTS

| | | | | |
|---|---|---|---|---|
| 4,814,840 A | * | 3/1989 | Kameda ................. | 357/23.5 |
| 5,049,515 A | * | 9/1991 | Tzeng .................. | 437/43 |
| 5,293,084 A | * | 3/1994 | Itoh et al. ............... | 307/446 |
| 5,371,023 A | * | 12/1994 | Minami et al. ............ | 437/35 |
| 5,401,990 A | * | 3/1995 | Nakagawara ............. | 257/231 |
| 5,488,244 A | * | 1/1996 | Quek et al. ............. | 257/314 |
| 5,495,441 A | * | 2/1996 | Hong .................. | 365/185.01 |
| 5,781,031 A | * | 7/1998 | Bertin et al. ............ | 326/39 |
| 6,365,942 B1 | * | 4/2002 | Kocon et al. ........... | 257/376 |
| 6,504,204 B1 | * | 1/2003 | Hsu et al. .............. | 257/306 |

FOREIGN PATENT DOCUMENTS

JP            5-102480         4/1993

* cited by examiner

*Primary Examiner*—Matthew Smith  
*Assistant Examiner*—Renzo N. Rocchegiani  
(74) *Attorney, Agent, or Firm*—Nixon & Vanderhye, P.C.

(57) ABSTRACT

A MOSFET includes: a first conductivity type a semiconductor substrate having a trench formed in a surface area thereof, a gate electrode formed on the semiconductor substrate; and a trench gate electrode which is adjacent to the gate electrode and is buried in the trench, and which generates an output by AND logic in response to inputs to the gate electrode and the trench gate electrode, wherein an impurity concentration directly below the gate electrode is higher than an impurity concentration directly below the trench gate electrode.

5 Claims, 11 Drawing Sheets

B Concentration Ratio(depth of 0.05 μm /0.27 μm)

Fig. 14

Ion/Ioff Ratio

MOSFET, SEMICONDUCTOR DEVICE USING THE SAME AND PRODUCTION PROCESS THEREFOR

CROSS-REFERENCE TO RELATED APPLICATION

This application is related to Japanese Patent Application No. 2001–240865 filed on Aug. 8, 2001, whose priority is claimed under 35 USC §119, the disclosure of which is incorporated by reference in its entirety.

BACKGROUND OF THE INVENTION

1. Field of the Invention

The present invention relates to a MOSFET, a semiconductor device using the MOSFET and a process for producing the semiconductor device. More particularly, the MOSFET can be switched to ON/OFF by applying two kinds of gate voltage and generates an output by AND logic in response to inputs to gates.

2. Description of Related Art

MOS transistors, memory cells and other semiconductor devices have been microfabricated according to the scaling law proposed by J. R. Brews in order to realize high integration.

However, with progress of microfabrication, there arise major tasks in actual devices such as occurrence of leakage current at gate insulating films owing to reduced thickness of the gate insulating films, increase in resistance of source/drain diffusion layers owing to reduced junction depth (Xj) of the source/drain diffusion layers, decrease in punch-through withstand voltage between the source/drain regions owing to a short-channel effect.

Figure 15:
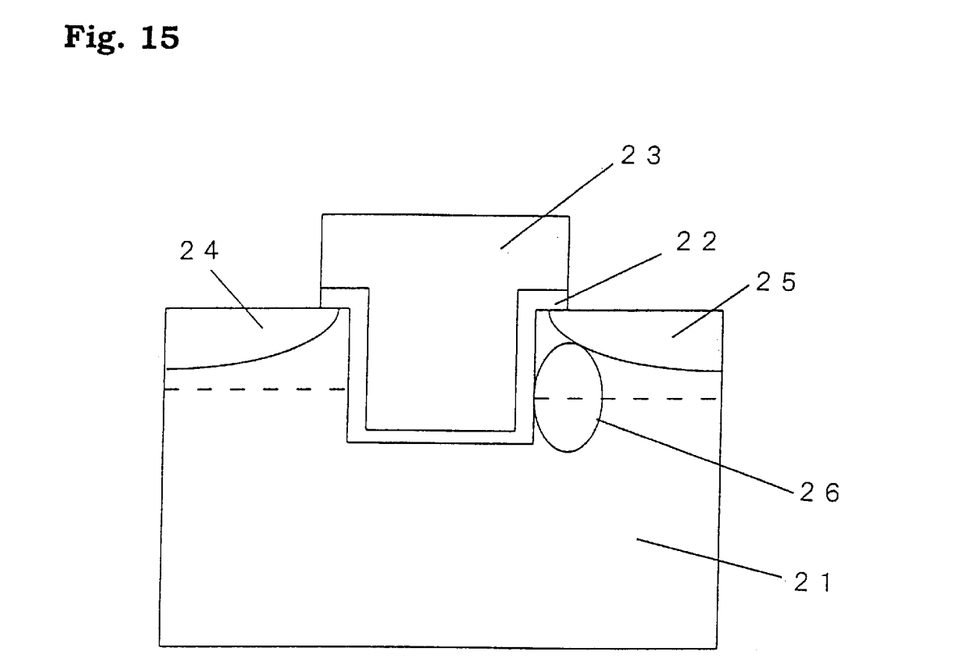
FIG. 15 is a schematic sectional view of a major part of a conventional trench-type MOS transistor.
Figure 16:
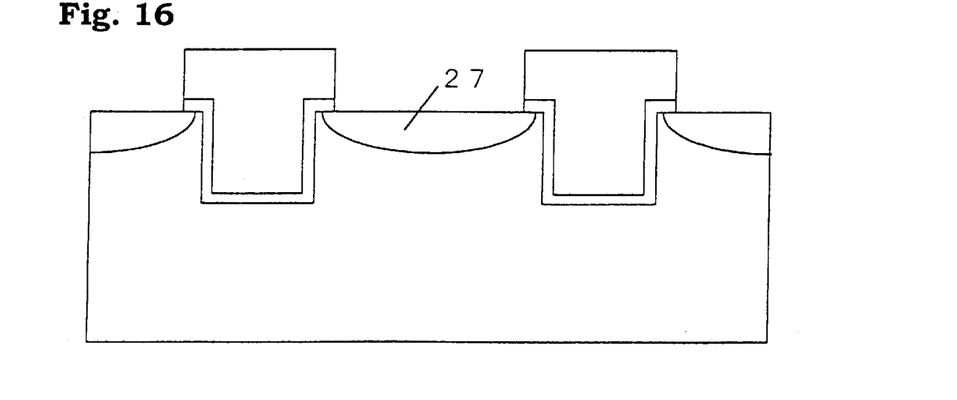
FIG. 16 is an equivalent circuit diagram of a MOS transistor of two-input AND type using a conventional trench-type MOS transistor.

Referring to FIG. 15, there is proposed a semiconductor device wherein a gate electrode 23 is disposed in a trench formed in a semiconductor substrate 21 of about 0.4 to 0.6 $\mu$m depth with intervention of a gate insulating film 22 so that an effective channel length is increased while a plan-view channel length is decreased. Also by forming a high-concentration region 26 at least below a source region 24 or a drain region 25, the short-channel effect can be reduced. The high-concentration region 26 is of the same conductivity type as that of the semiconductor substrate 21 and has a higher impurity concentration than that of the semiconductor substrate 21 (see Japanese Unexamined Patent Publication No. HEI 5(1993)-102480).

Figure 5:
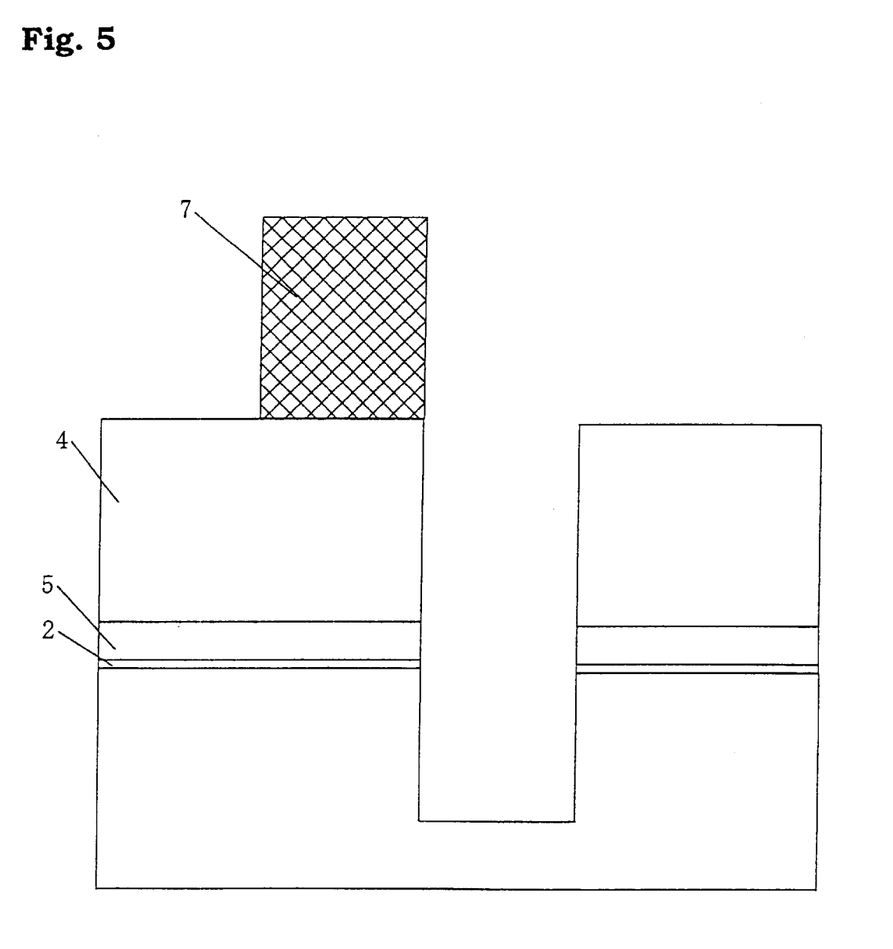

The high concentration region 26 functions as a punch-through stopper diffusion layer and has a peak of concentration along a dotted line in FIG. 5. By forming the trench deeper than the high concentration region 26, the channel region is formed in a low-concentration region. This construction suppresses extension of depletion layers from the source and drain regions 24 and 25, thereby improving the punch-through withstand voltage.

In this semiconductor device, boron ions are implanted so that the boron concentration has the peak at the depth represented by the dotted line in FIG. 15 for forming the punch-through stopper diffusion layer. Since boron ions have a large diffusion coefficient, they diffuse in a depth direction into the semiconductor substrate 21. Accordingly, unless the trench is deep enough, the concentration of the impurity of the same conductivity type as that of the substrate increases in the entire channel region. Consequently, in the channel region, carrier mobility is declined due to scattering by the impurity and a drive current decreases.

Therefore, there is a problem in that the trench needs to be formed deep for increasing the drive current.

Further, in the case where an AND circuit is constructed by use of such a semiconductor device, it is necessary to dispose a diffusion layer between connected two transistors. Therefore, there is a problem in that occupied area increases.

SUMMARY OF THE INVENTION

The present invention provides a MOSFET which comprises a first conductivity type a semiconductor substrate having a trench formed in a surface area thereof, a gate electrode formed on the semiconductor substrate; and a trench gate electrode which is adjacent to the gate electrode and is buried in the trench, and which generates an output by AND logic in response to inputs to the gate electrode and the trench gate electrode, wherein an impurity concentration directly below the gate electrode is higher than an impurity concentration directly below the trench gate electrode.

The present invention also provides a process for manufacturing a semiconductor device comprising the steps of:

(a) implanting impurity ions of a first conductivity type in a semiconductor substrate of the first conductivity type;

(b) forming a gate insulating film, a first conductive film and an insulating film in this order on the semiconductor substrate;

(c) forming a first resist pattern having a desired configuration on the insulating film;

(d) etching the insulating film, the first conductive film and the gate insulating film using the first resist pattern as a mask and further etching the semiconductor substrate to form a trench;

(e) forming a second resist pattern having a desired configuration on the insulating film after removing the first resist pattern;

(f) patterning the insulating film and the first conductive film to form a gate electrode using the second resist pattern as a mask;

(g) forming a trench gate insulating film in the trench;

(h) depositing a second conductive film over the resulting semiconductor substrate including the trench;

(i) etching back the second conductive film so that the second conductive film is buried in the trench, thereby forming a trench gate electrode;

(j) implanting impurity ions of a second conductivity type in the semiconductor substrate using the gate electrode and the trench gate electrode as a mask; and (k) annealing for activation the resulting semiconductor substrate to form source/drain regions of a second conductivity type and a high-concentration impurity diffusion layer of a first conductivity type directly below the gate electrode These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

The MOSFET of the present invention is constructed mainly of a semiconductor substrate of a first conductivity type, a gate electrode formed thereon, a trench gate electrode buried in a trench in a surface region of the semiconductor substrate, and source/drain regions.

The semiconductor substrate of the first conductivity type is not particularly limited and may be any substrate on which semiconductor devices are usually formed. For example, any substrate such as an element semiconductor substrate, a compound semiconductor substrate, a so-called SOI substrate or the like may be used. The first conductivity type means either an n type or a p type, and the impurity concentration is preferably set to such a degree that the substrate can usually be used as a substrate for semiconductor devices.

The gate electrode is disposed on the semiconductor substrate usually with intervention of a gate insulating film. The trench gate electrode is disposed in the trench formed in the surface region of the semiconductor substrate adjacently to the gate electrode, the trench gate electrode being buried in the trench with intervention of a trench gate insulating film. The material for and the thickness of the gate insulating film and the trench gate insulating film are not particularly limited so long as they allow the gate and trench gate insulating films to function as gate insulating films in ordinary MOSFETs. The material for and the thickness and shape of the gate electrode and the trench gate electrode are not particularly limited so long as they allow the gate and trench gate electrodes to function as gate electrodes in ordinary MOSFETs. Examples of materials for the gate electrode and the trench gate electrode include metals such as aluminum, copper, nickel, platinum, tantalum, titanium, tungsten and the like, alloys of these metals, polysilicon, and silicides and polycides of these metals. The thickness of the gate electrode and the trench gate electrode may be adjusted as appropriate depending upon desired characteristics of the MOSFET, voltages to be applied to the MOSFET and the like. The thickness of the trench gate electrode, especially, can be adjusted as appropriate by the depth of the trench formed in the surface region of the semiconductor substrate. More particularly, the gate electrode may be about 20 to 100 nm thick, and the trench gate electrode may be about 100 to 500 nm thick. The gate electrode and the trench gate electrode may preferably be arranged to generate an output by AND logic in response to the gate electrode and the trench gate electrode, and may preferably be arranged not to contact each other directly but to be electrically connected to each other, for example, by intervention of an insulating film such as the gate insulating film, the trench gate insulating film or the like, or by separation to such an extent that the gate electrode and the trench gate electrode are not electrically conducted.

The concentration of the impurity of the first conductivity type is set to be higher in the surface region of the semiconductor substrate directly below the gate electrode than that in the semiconductor substrate directly below the trench gate electrode. In this case, the impurity of the first conductivity type may be introduced only in the surface region of the semiconductor substrate directly below the gate electrode, or the concentration of the impurity of the first conductivity type may be set higher in the surface region and be gradually decreased in a depth direction. Alternatively, an impurity of the second conductivity type may be introduced in the semiconductor substrate directly below the trench gate electrode, thereby canceling the conductivity by the impurity of the first conductivity type and, as a result, decreasing the concentration of the impurity of the first conductivity type. The impurity concentration just under the gate electrode is not particularly limited so long as it is higher than the impurity concentration just under the trench gate electrode, but may be about 1.5, 2, 2.5, 3 or more times, preferably about 3.3 or more times, more preferably about 3.8 or more times or 4 or more times higher than the impurity concentration just under the trench gate electrode. More particularly, the impurity concentration just under the gate electrode may be preferably equal to or higher than $2 \times 10^{17}/cm^3$, more preferably $2.2 \times 10^{17}/cm^3$, still more preferably $2.6 \times 10^{17}/cm^3$ and most preferably $2.8 \times 10^{17}/cm^3$, and the impurity concentration just under the trench gate electrode may preferably be lower than $1 \times 10^{17}/cm^3$, $9 \times 10^{16}/cm^3$ or $8 \times 10^{16}/cm^3$. In the case where the concentration of the impurity of the first conductivity type is decreased in the semiconductor substrate just under the trench gate electrode by introducing the impurity of the second conductivity type therein, it is suitable to introduce the impurity of the second conductivity type in the semiconductor substrate of the first conductivity type in the vicinity of the bottom of the trench gate electrode in a concentration of 90% or less of the concentration of the impurity of the first conductivity type in this region.

In the MOSFET of the present invention, the source/drain regions are formed at one end of the gate electrode and opposite end of the trench gate electrode, that is, both ends of a pair of the gate electrode and the trench gate electrode. The source/drain regions may preferably be formed in self-alignment with the gate electrode and the trench gate electrode. Their junction depth and impurity concentration are not particularly limited so long as the depth and concentration allow the source/drain regions to function as source/drain regions in ordinary MOSFETs.

The MOSFET of the present invention is applicable to any kind of semiconductor device. That is, a plurality of MOSFETs of the present invention may be combined to form a circuit. The MOSFET(s) of the present invention may also be combined with other elements such as transistors, capacitors, resistances etc., circuits and the like to form a larger-scale circuit and other devices.

In the process for manufacturing a semiconductor device of the present invention, in the step (a), impurity ions of the first conductivity type are implanted in the semiconductor substrate of the first conductivity type. This ion implantation may preferably be carried out under such conditions that the concentration of the impurity of the first conductivity type can be increased only in the surface region of the semiconductor substrate. The surface region here means a region having a depth of about 100 nm or less from the surface of the semiconductor substrate, in other words, a region having a depth of about 50 to 100 nm under the source/drain regions to be formed in a later step. For example, the implantation energy may be about 10 to 40 keV thought it depends upon the species of the ions. The ion implantation may preferably be performed via an insulating film of appropriate thickness, for example, an insulating film of such a material having a thickness suitable for the gate insulating film. Also, impurity ions may be implanted in the semiconductor substrate a plurality times with different implantation energy and different dose so as to form a state in which the concentration of the first conductivity type impurity is higher in the surface region and is gradually decreased in a depth direction.

In the step (b), a gate insulating film, a first conductive film and an insulating film are formed sequentially on the semiconductor substrate. For the gate insulating film here, the insulating film used for the ion implantation in the step (a) may be used as it is, or another insulating film may be formed. The insulating film may be formed of such a material or a thickness that can function as an etching mask when the first conductive film and a second conductive film described below are patterned to form gate electrodes or the like and that can also function as a protective film. More particularly, the insulating film may be formed of a silicon nitride film, a silicon oxide film and a laminated film of these materials.

In the step (c), a first resist pattern having a desired configuration is formed on the insulating film. The first resist pattern may be formed by a known technique, for example, by photolithography and etching.

In the step (d), using the first resist pattern as a mask, the insulating film, the first conductive film and the first gate insulating film are etched, and further, a trench is formed in the semiconductor substrate. The etching technique and conditions here are not particularly limited so long as the materials for the insulating film, the first conductive film and the first gate insulating film can be etched away. For example, there may be mentioned wet etching using an acid or an alkaline solution, dry etching such as RIE, etc. The depth of the trench may preferably be set by taking into consideration etching for patterning the first conductive film into the gate electrode in a later step.

After the trench is formed in the semiconductor substrate, impurity ions of the second conductivity type may be implanted to such a degree that the semiconductor substrate can maintain the first conductivity type. The implantation energy, dose and numbers of the ion implantation here may preferably be adjusted by taking into consideration etching for patterning the first conductive film into the gate electrode in the later step. The dose of the ion implantation may preferably be set so that the semiconductor substrate of the first conductivity type in the vicinity of the bottom of the trench contains the impurity of the second conductivity type in a concentration of about 90% or less of the concentration of the impurity of the first conductivity type in this region.

In the step (e), a second resist pattern having a desired configuration is formed on the insulating film again after removing the resist pattern as described above. The second resist pattern here may be formed in a manner similar to the manner in the step (c).

In the step (f), using the second resist pattern as a mask, the insulating film and the first conductive film are patterned to form a gate electrode. Patterning here may be performed in a manner similar to the above-mentioned etching technique.

In the step (g), a trench gate insulating film is formed in the trench. The trench gate insulating film may be formed in a manner similar to the above-described manner for forming the gate insulating film. The trench insulating film is preferably formed not only in the inside of the trench but also on a sidewall of the gate electrode exposed above the trench.

In the step (h), a second conductive film is deposited over the resulting semiconductor substrate including the trench. The second conductive film may be deposited in a manner similar to the manner for forming the first conductive film using the same material as that of the first conductive film, but does not necessarily need to be formed of the same material in the same thickness as the first conductive film. Preferably, the second conductive film is formed in such a thickness that the trench is buried almost completely or thicker.

In the step (i), the second conductive film is etched back so that the second conductive film is buried in the trench, thereby forming a trench gate electrode. Etching back here may be performed either by wet etching or by dry etching or by partially using a CMP technique. Preferably, the second conductive film is etched back to such a degree that the trench is buried almost completely, that is, the top surface of the second conductive film is almost at the same level as the surface of the semiconductor substrate before the trench is formed.

In the step (j), impurity ions of the second conductivity type are implanted in the semiconductor substrate by use of the gate electrode and the trench gate electrode as a mask. The ion implantation here is for forming the source/drain regions, and the method and conditions therefor may be adjusted as appropriate by taking into consideration the junction depth of the source/drain regions, the impurity concentration therein and the like. The ion implantation may be carried out after the insulating film formed on the gate electrode in the previous step is removed or without removing the insulating film.

In the step (k), the resulting semiconductor substrate is annealed for activation. The annealing method and conditions may be adjusted as appropriate by taking into consideration the species of the implanted ions, desired performance of the MOSFET and the like. For example, the annealing may be performed by ramp annealing, oven annealing, RTA or the like in an ordinary atmosphere, a nitrogen atmosphere or the like within a temperature range from 500 to 1,000° C. for 5 seconds to 50 minutes. Thereby the source/drain regions are formed on both sides of a pair of the gate electrode and the trench gate electrode, and also a high-concentration impurity diffusion layer of the first conductivity type is formed in the surface region of the semiconductor substrate directly below the gate electrode. If ions are implanted to the bottom of the trench in the step (d), a low-concentration impurity diffusion layer of the first conductivity type is formed in the vicinity of the trench bottom by the annealing for activation.

An embodiment of the MOSFET of the present invention is now described with reference to FIGS. 1 to 15.

Figure 1:
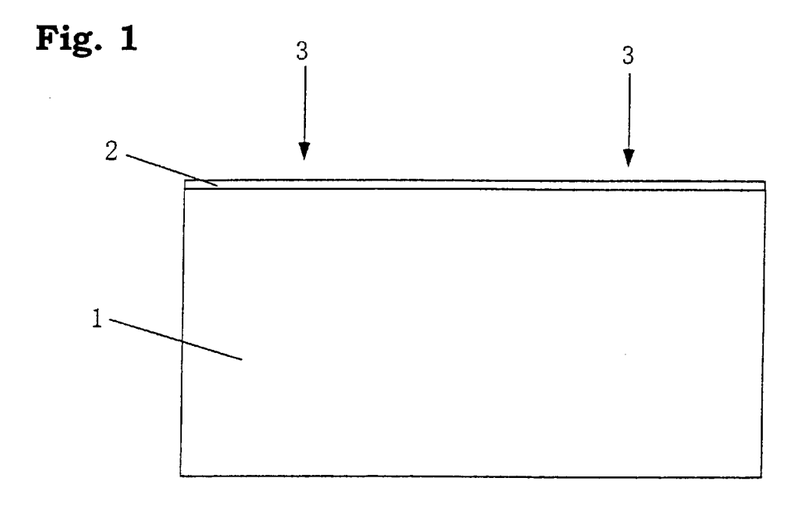
FIGS. 1 to 10 are schematic sectional views of a major part of a semiconductor device for illustrating an embodiment of a process for producing a semiconductor device in accordance with the present invention.

First, as shown in FIG. 1, a p-type silicon substrate 1 having an impurity concentration of $1 \times 10^{16}$ to $1 \times 10^{17}/cm^3$ is thermally oxidized to form a planar gate oxide film 2 of about 6 to 10 nm thickness. Then, ions 3 of boron, $BF_2$ or the like, for example, are implanted at an implantation energy of 10 to 40 keV and a dose of $7 \times 10^{12}$ to $5 \times 10^{13}/cm^2$.

Figure 2:
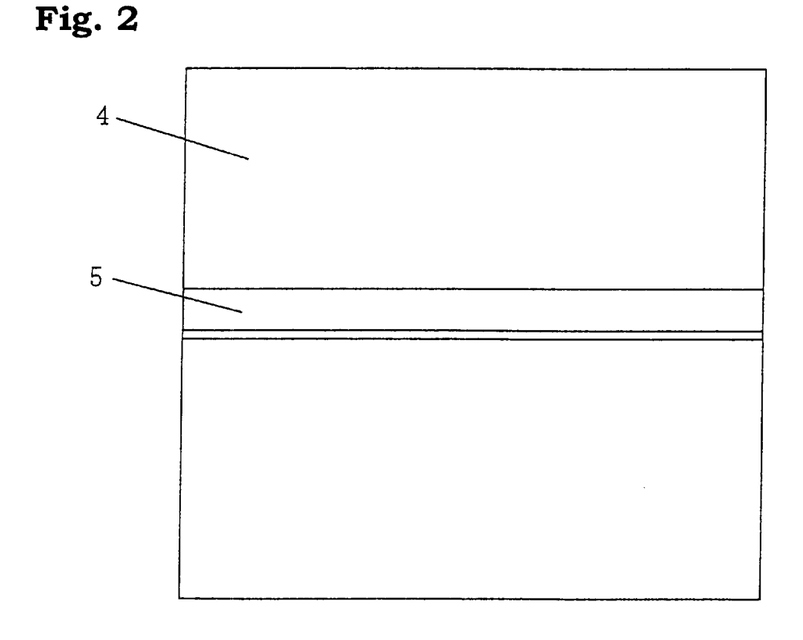
Figure 3:
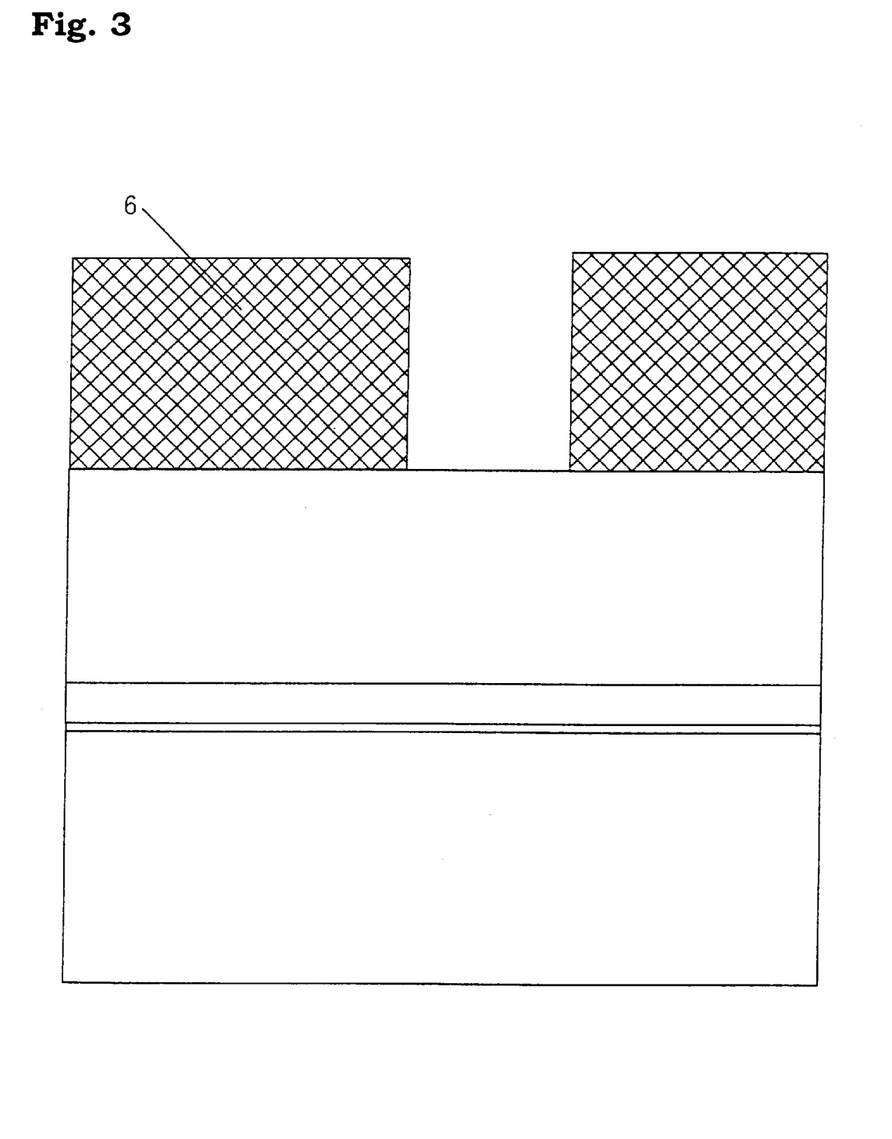

Thereafter, as shown in FIG. 2, a first polysilicon layer 5 of about 50 nm thickness and a silicone nitride film 4 of about 250 nm thickness are sequentially formed, and as shown in FIG. 3, a resist pattern 6 having an opening in a desired region is formed by photolithography.

Figure 4:
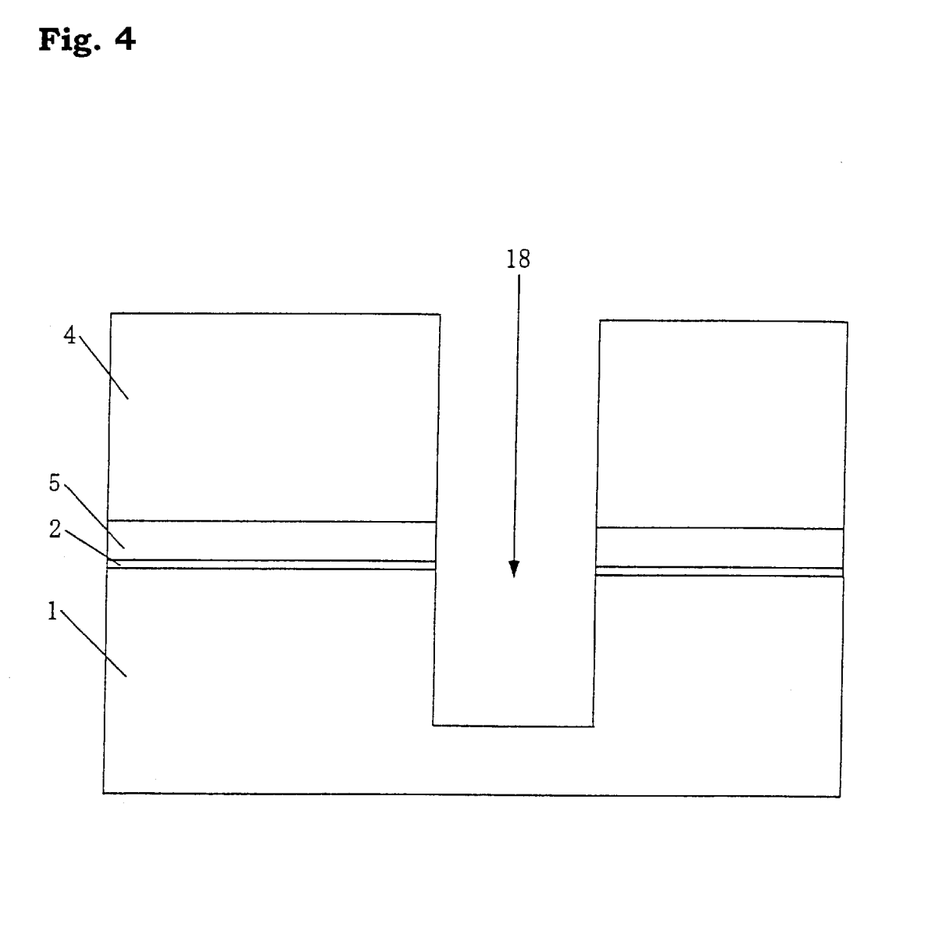

Subsequently, as shown in FIG. 4, using the resist pattern 6 as a mask, the silicon nitride film 4, the first polysilicon layer 5 and the planar gate oxide film 2 are etched and further the silicon substrate 1 is etched about 120 to 500 nm deep to form a trench. Then the resist pattern 6 is removed. Phosphorus ions 18 are implanted to the bottom of the trench in the resulting silicon substrate 1 at an implantation energy of 5 to 40 keV and a dose of $1 \times 10^{12}$ to $2 \times 10^{13}/cm^2$.

Figure 6:
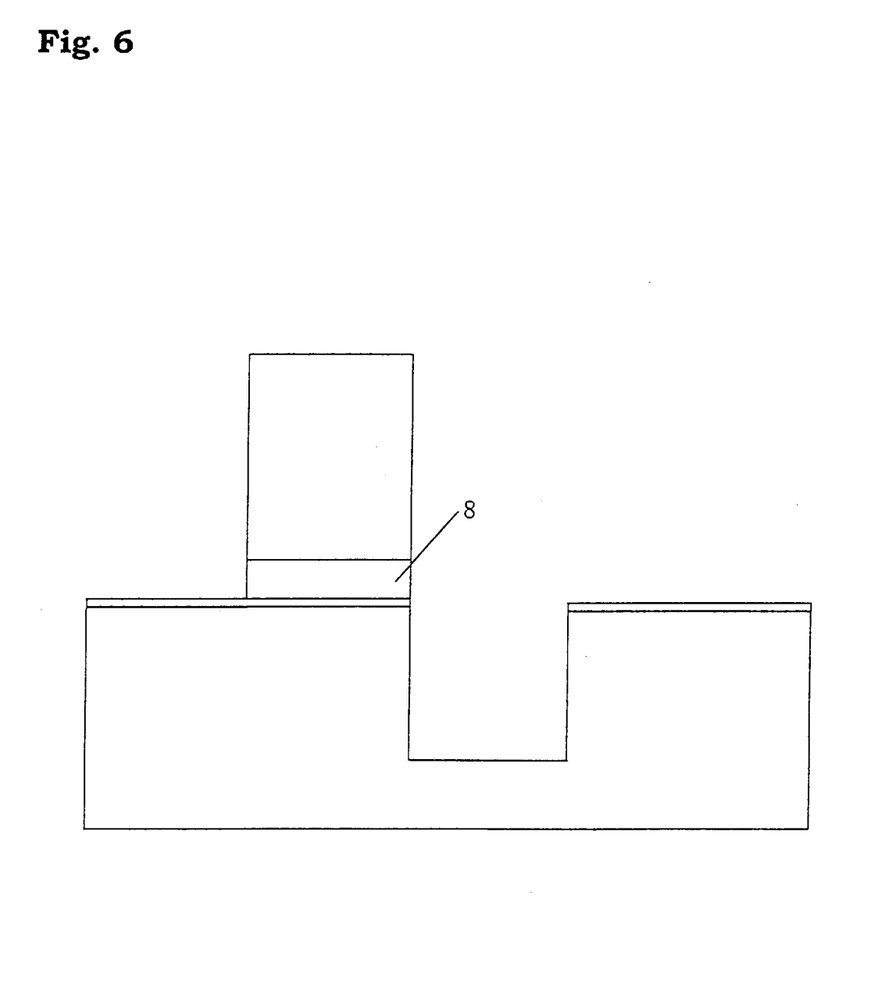

Subsequently, resist is applied to the resulting silicon substrate 1, and as shown in FIG. 5, is formed by photolithography into a resist pattern 7 covering a region in which a planar gate electrode is to be formed. Using the resist pattern 7 as a mask, the silicon nitride film 4 and the first polysilicon layer 5 are etched as shown in FIG. 6. Thereafter, the resist pattern 7 is removed, and thus, the planar gate electrode 8 is formed. By this process, the bottom of the trench in the silicon substrate 1 is partially etched. The etch amount should be taken into consideration beforehand at setting the depth of the trench and the implantation energy of phosphorus ions 18 at the bottom of the trench.

Figure 7:
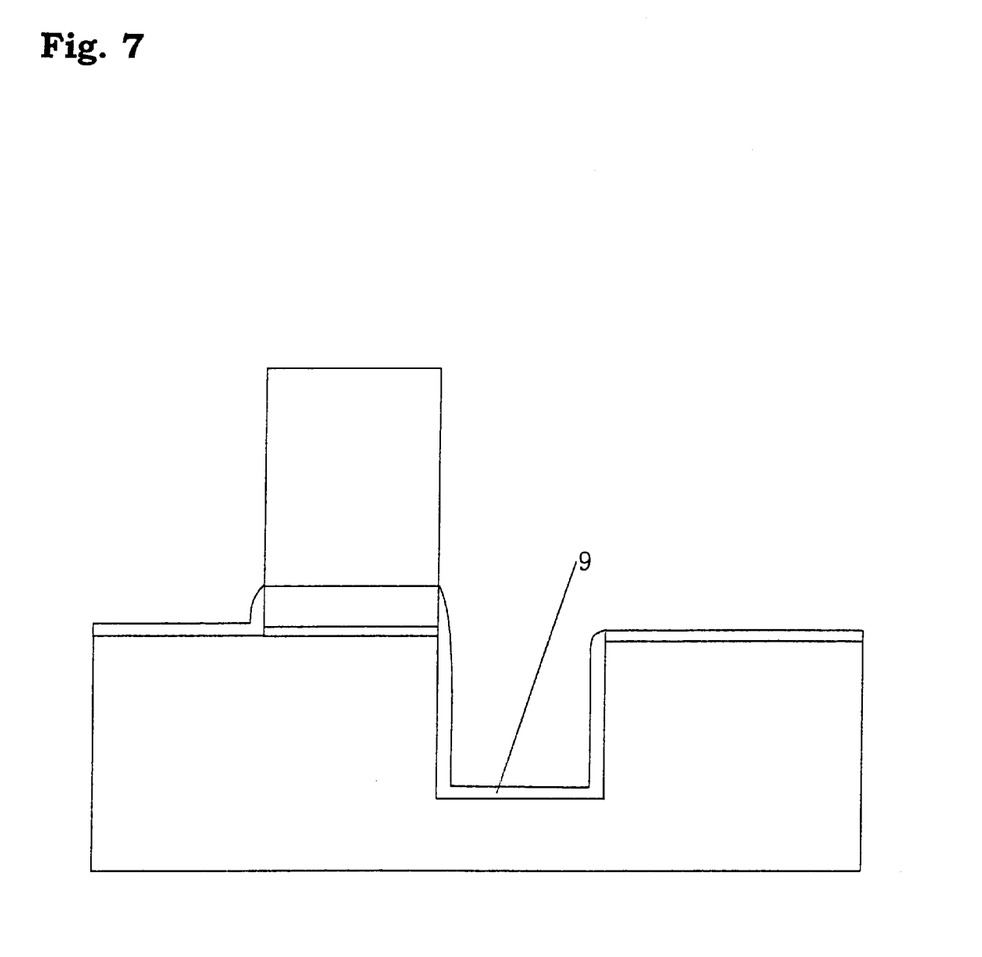
Figure 8:
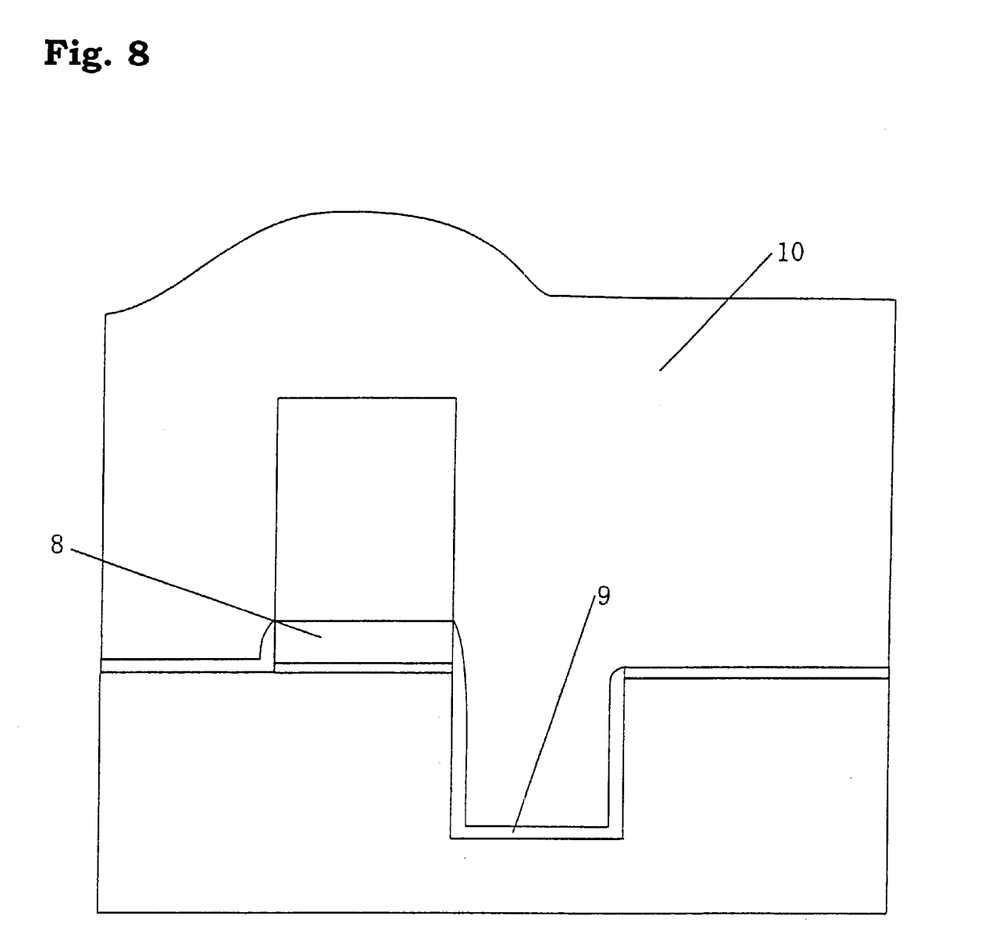

Next, as shown in FIG. 7, the resulting silicon substrate 1 is thermally oxidized to form a trench gate oxide film 9 of about 10 to 16 nm thickness. Then, as shown in FIG. 8, a second polysilicon layer 10 is formed on the resulting silicon substrate 1.

Figure 9:
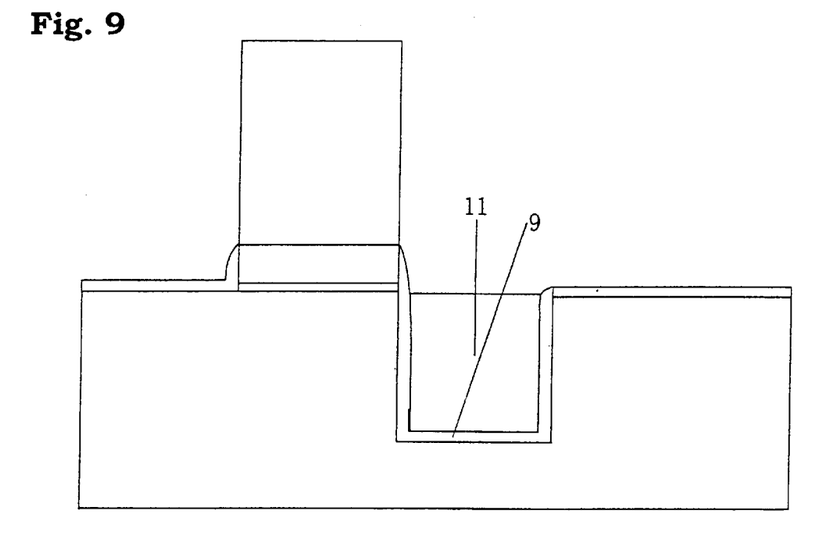

As shown in FIG. 9, the second polysilicon layer 10 is etched back to almost the same level as the surface of the silicon substrates, and thereby, the second polysilicon layer 10 is buried in the trench to form a trench gate electrode 11.

Figure 10:
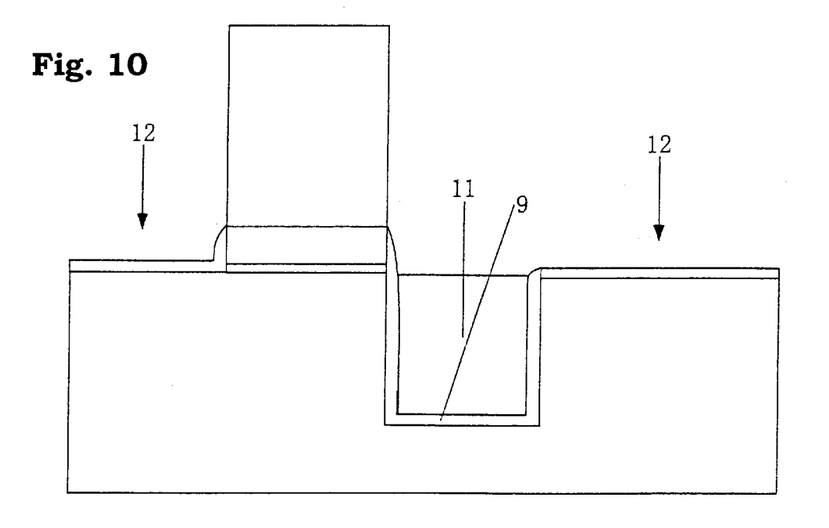

Subsequently, as shown in FIG. 10, arsenic ions 12 are implanted at an implantation energy of about 5 to 40 keV and a dose of $1 \times 10^{14}$ to $1 \times 10^{16}/cm^2$.

Figure 11:
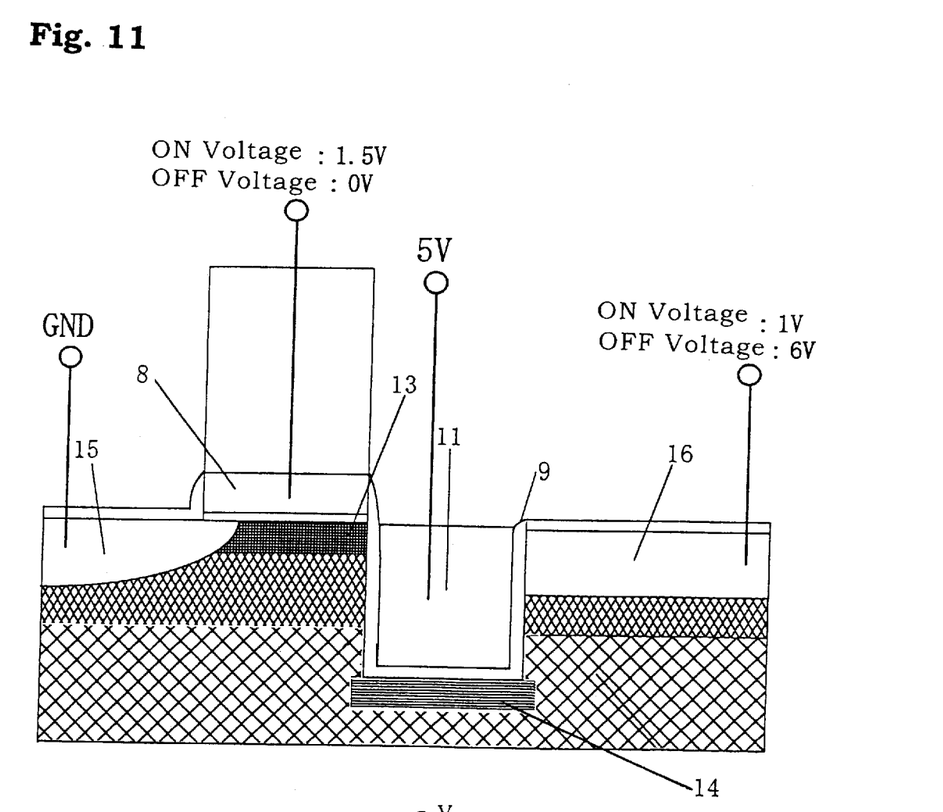
FIG. 11 is a schematic sectional view of a major part of an embodiment of a semiconductor device in accordance with the present invention.

Thereafter, for recovering crystals in the implanted region and activating the implanted impurity, annealing is carried out at a temperature of about 800° C. for about 30 minutes. Thereby, as shown in FIG. 11, a source region 15 and a drain region 16 are formed, and a boron high-concentration region 13 is formed directly below the planar gate electrode 8, and the boron low-concentration region 14 is formed in the vicinity of the bottom of the trench gate electrode 11.

Thus, while maintaining the p-type conductivity, the concentration of the impurity of the same conductivity type as that of the substrate does not become too high in the entire channel region. That is, a high p-type impurity concentration is ensured just under the planar gate electrode, and therefore, the OFF characteristics can be improved. Also a low p-type impurity concentration is ensured just under the trench gate electrode, and therefore, a decline in the ON current can be suppressed, and a high ON current/OFF current ratio can be obtained.

Figure 12:
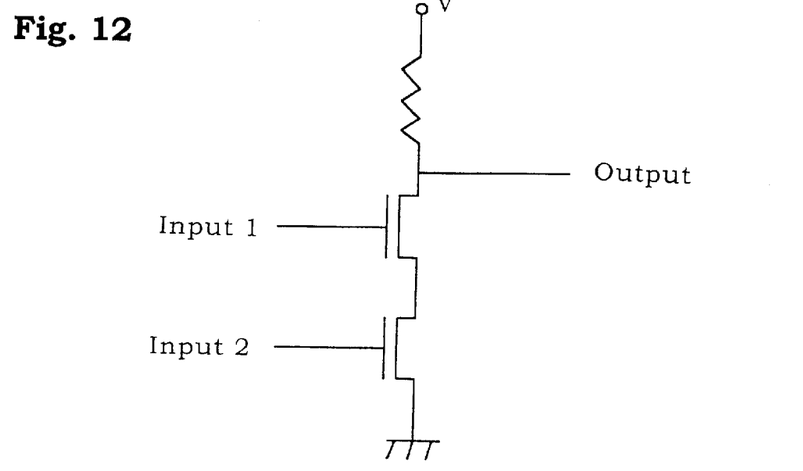
FIG. 12 is an equivalent circuit diagram of a semiconductor device in accordance with the present invention.

As shown in FIG. 12, this semiconductor device produces an output by AND logic in response to inputs to the respective gates. As shown in FIG. 11, an ON current flows when 5 V, 1.5 V and 1 V is applied to the trench gate electrode 11, the planar gate electrode 5 and the drain region 16, respectively. An OFF current flows when 5 V, 6 V and 0 V are applied to the trench gate electrode 11, the drain region 16 and the planar gate electrode 5, respectively.

Figure 13:
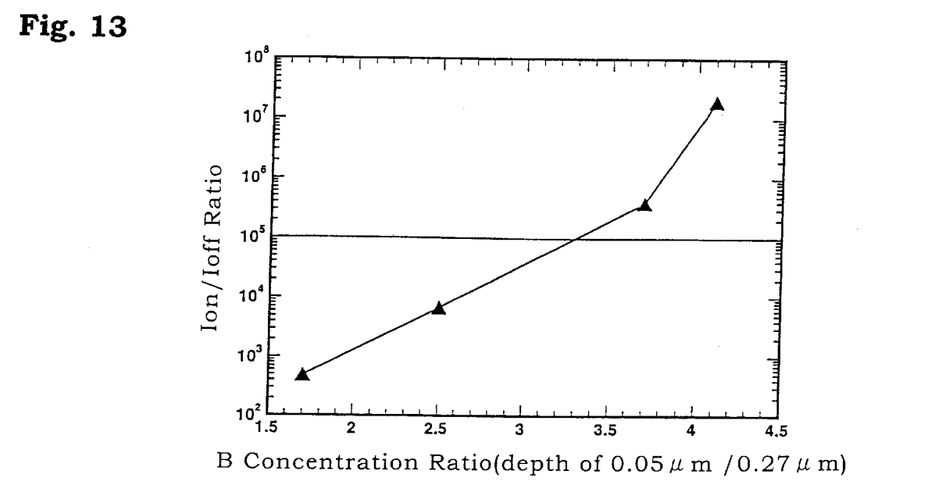
FIG. 13 is a graphical representation showing a relationship between the impurity concentration in a substrate and an Ion/Ioff ratio in a semiconductor device in accordance with the present invention.

FIG. 13 shows dependency of an Ion/Ioff ratio upon the ratio of the boron concentration in the high-concentration region 13 (at a position of 0.05 μm depth from the surface of the substrate) just under the planar gate electrode 5 and the boron concentration in the low-concentration region 14 (at a position of 0.27 μm depth from the surface of the substrate, at a position of 0.05 μm depth from the surface of the bottom of the trench) just under the trench gate electrode 11. The same voltages as mentioned above are applied to respective terminals in the ON/OFF states.

As clearly understood from FIG. 13, an Ion/Ioff ratio of $10^5$ or more can be ensured within a boron concentration ratio range of 3.3 or more. Thereby, a reading current can be set large, and also the Off current decreased, which can prevent mis-reading.

Figure 14:
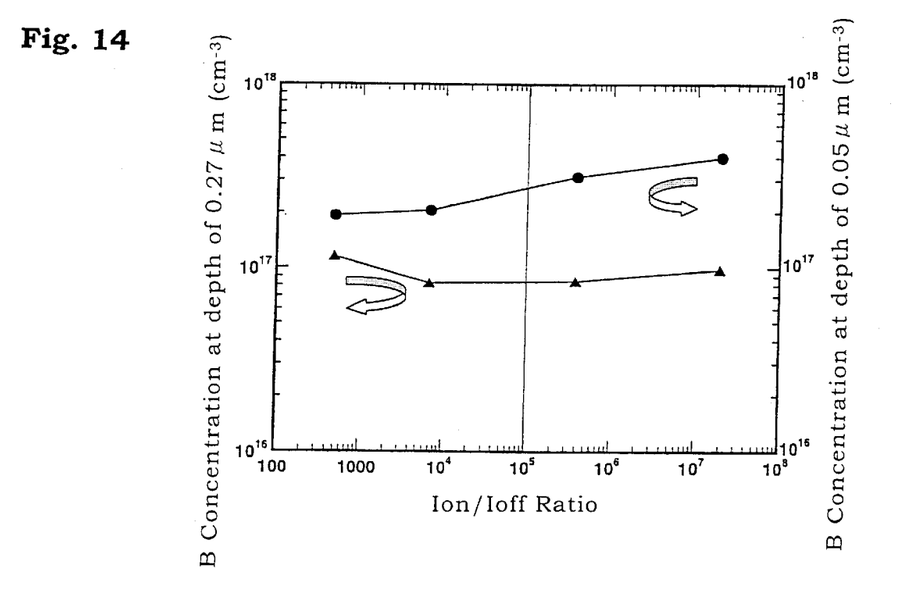
FIG. 14 is another graphical representation showing a relationship between the impurity concentration in a substrate and an Ion/Ioff ratio in a semiconductor device in accordance with the present invention.

FIG. 14 shows dependency of the Ion/Ioff ratio upon the boron concentration in the high-concentration region 13 (at a position of 0.05 μm depth from the surface of the substrate) just under the planar gate electrode 5 and the boron concentration in the low-concentration region 14 (at a position of 0.27 μm depth from the surface of the substrate, at a position of 0.05 μm depth from the surface of the bottom of the trench) just under the trench gate electrode 11. The same voltages as mentioned above are applied to the respective terminals in the ON/OFF states.

As clearly understood from FIG. 14, an Ion/Ioff ratio of $10^5$ or more can be ensured if the boron concentration just under the trench gate electrode 11 is lower than about $1 \times 10^{17}/cm^3$ and the boron concentration just under the planar gate electrode 5 is about $2.2 \times 10^{17}/cm^3$ or higher.

According to the present invention, in a MOSFET which has a gate electrode formed on a semiconductor substrate of a first conductivity type and a trench gate electrode adjacent to the gate electrode, the trench gate electrode being buried in a trench formed in a surface region of the semiconductor substrate, and produces an output by AND logic in response to inputs to the gate electrodes, the impurity concentration directly below the gate electrode is higher than the impurity concentration directly below the trench gate electrode. Thereby OFF characteristics can be improved in the channel region directly below the gate electrode, and also a reversed layer can be easily formed in the channel region directly below the trench gate electrode. Consequently, it is possible to effectively suppress a decline in the driving performance of the MOSFET.

It is possible to provide a microfabricated AND circuit and also ensure an ON current/OFF current ratio of $10^5$ or more in the case where the impurity concentration directly below the gate electrode is 3.3 or more times larger than the impurity concentration directly below the trench gate electrode; in the case where the impurity concentration directly below the gate electrode is $2.2 \times 10^{17}/cm^3$ or higher and the impurity concentration directly below the trench gate electrode is lower than $1 \times 10^{17}/cm^3$; and in the case where the impurity of the second conductivity type is contained in the semiconductor substrate in the vicinity of the bottom of the trench gate electrode in a concentration of 90% or lower of the concentration of the impurity of the first conductivity type in this region.

What is claimed is:

1. A MOSFET which comprises
    a first conductivity type a semiconductor substrate having a trench formed in a surface area thereof,
    a gate electrode formed on the semiconductor substrate; and
    a trench gate electrode which is adjacent to the gate electrode and is buried in the trench, and
    which generates an output by AND logic in response to inputs to the gate electrode and the trench gate electrode, wherein an impurity concentration directly below the gate electrode is higher than an impurity concentration directly below the trench gate electrode.

2. A MOSFET according to claim 1, wherein the impurity concentration directly below the gate electrode is 3.3 or more times higher than that directly below the trench gate electrode.

3. A MOSFET according to claim 1, wherein the impurity concentration directly below the gate electrode is $2.2 \times 10^{17}/cm^3$ or higher and the impurity concentration directly below the trench gate electrode is lower than $1 \times 10^{17}/cm^3$.

4. A MOSFET according to claim 1, wherein the semiconductor substrate of the first conductivity type in a region near the bottom of the trench gate electrode contains an impurity of a second conductivity type in a concentration of 90% or lower of the impurity concentration of the first conductivity type in the region.

5. A semiconductor device comprising a MOSFET as set forth in claim 1.

* * * * *